United States Patent
Mao et al.

(10) Patent No.: US 10,497,642 B2
(45) Date of Patent: Dec. 3, 2019

(54) INTEGRATED POWER SEMICONDUCTOR PACKAGING APPARATUS AND POWER CONVERTER

(71) Applicant: General Electric Company, Schenectady, NY (US)

(72) Inventors: Saijun Mao, Shanghai (CN); Bo Qu, Shanghai (CN); Jingkui Shi, Shanghai (CN); He Xu, Shanghai (CN); Jie Shen, Shanghai (CN); Lin Lan, Shanghai (CN); Rui Li, Shanghai (CN); Zhihui Yuan, Shanghai (CN); Alistair Martin Waddell, Garching bei Munchen (DE); Stefan Schroeder, Garching bei Munchen (DE); Marius Michael Mechlinski, Garching bei Munchen (DE); Mark Aaron Chan, Garching bei Munchen (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/981,975

(22) Filed: May 17, 2018

(65) Prior Publication Data
US 2018/0337109 A1  Nov. 22, 2018

(30) Foreign Application Priority Data
May 17, 2017 (CN) .......................... 2017 1 0347397

(51) Int. Cl.
*H01L 23/34* (2006.01)
*H01L 23/473* (2006.01)
(Continued)

(52) U.S. Cl.
CPC .......... *H01L 23/473* (2013.01); *H01L 23/367* (2013.01); *H01L 25/072* (2013.01); *H01L 25/115* (2013.01)

(58) Field of Classification Search
CPC ..................................................... H01L 23/473
See application file for complete search history.

(56) References Cited

U.S. PATENT DOCUMENTS

2007/0216013 A1* 9/2007 Funakoshi .......... H01L 23/3735
257/691
2008/0265440 A1  10/2008 Mahler
(Continued)

FOREIGN PATENT DOCUMENTS

| CN | 102060116 A | 5/2011 |
|---|---|---|
| CN | 105632947 A | 6/2016 |
| JP | S5595352 A | 7/1980 |

OTHER PUBLICATIONS

Abdo et al., "Continuous Operation at 200/spl deg/C Device Junction Temperature: The Final Frontier for RF Power Semiconductor Plastic Packaging", 54th Electronic Components and Technology Conference Proceedings, http://ieeexplore.ieee.org/document/1319376/, Jun. 4, 2004.
(Continued)

*Primary Examiner* — Didarul A Mazumber
*Assistant Examiner* — Wasiul Haider
(74) *Attorney, Agent, or Firm* — Wood IP LLC

(57) ABSTRACT

The present disclosure relates to an integrated power semiconductor packaging apparatus and a power converter containing the integrated power semiconductor packaging apparatus. The integrated power semiconductor packaging apparatus comprises a plurality of power semiconductor devices and an electrically insulative substrate formed integrally. The electrically insulative substrate comprises a flat surface, at least one separation wall protruding from the flat
(Continued)

surface and a flow channel inside the electrically insulative substrate. The at least one separation wall is configured to separate the flat surface into a plurality of flat areas, and each of the plurality of flat areas is configured to receive one of the plurality of power semiconductor devices. The flow channel is configured for allowing a coolant flowing through to remove heat from the plurality of power semiconductor devices.

9 Claims, 4 Drawing Sheets

(51) Int. Cl.
*H01L 25/07* (2006.01)
*H01L 23/367* (2006.01)
*H01L 25/11* (2006.01)

(56) References Cited

U.S. PATENT DOCUMENTS

| | | | |
|---|---|---|---|
| 2009/0166855 A1* | 7/2009 | Chiu | H01L 23/3675 257/715 |
| 2009/0231810 A1 | 9/2009 | Liang et al. | |
| 2010/0053889 A1 | 3/2010 | Miller et al. | |
| 2010/0175857 A1 | 7/2010 | Gerstler et al. | |
| 2013/0063897 A1 | 3/2013 | Howes et al. | |
| 2014/0353830 A1 | 12/2014 | Carpenter et al. | |
| 2016/0211193 A1* | 7/2016 | Mizuno | H01L 23/40 |
| 2018/0025964 A1* | 1/2018 | Kumari | H01L 23/473 257/714 |
| 2018/0194052 A1* | 7/2018 | Kawaguchi | B29C 45/72 |
| 2018/0352678 A1* | 12/2018 | Adams | H05K 7/20281 |
| 2018/0358302 A1* | 12/2018 | Tuominen | H01L 23/3107 |

OTHER PUBLICATIONS

Ackaert et al., "Metallization Scheme Optimization of Plastic-Encapsulated Electronic Power Devices", International Conference on IC Design & Technology (ICICDT), http://ieeexplore.ieee.org/document/7165907/, Jun. 1-3, 2015.

Wang et al., "Wafer-Level Vacuum Packaging Enabled by Plastic Deformation and Low-Temperature Welding of Copper Sealing Rings With a Small Footprint", Journal of Microelectromechanical Systems, vol. PP, Issue 99, pp. 1-9, http://ieeexplore.ieee.org/document/7845563/, Feb. 7, 2017.

Extended European Search Report and Opinion issued in connection with corresponding EP Application No. 18169391.2 dated Oct. 24, 2018.

* cited by examiner

INTEGRATED POWER SEMICONDUCTOR PACKAGING APPARATUS AND POWER CONVERTER

BACKGROUND

The present disclosure generally relates to an integrated power semiconductor packaging apparatus and a power converter containing the integrated power semiconductor packaging apparatus.

Power electronic technologies could not do without power converters. Power converter is generic term of power electronic circuits and devices that used for power conversion. There are four basic power conversion models: DC/AC inversion, AC/AC frequency conversion, AC/DC rectification, and DC/DC conversion. Power converter may have various forms. Generally it includes basic elements of power semiconductor devices, circuits with various topologies, and different control strategies, which are called as "three elements of a power converter". Wherein the power semiconductor devices are basic elements, which are critical for the reliability, cost and performance of a power converter.

Power semiconductor devices are electronic devices used as switches or rectifiers of a power converter. Due to the nature of the power semiconductor devices, the production of high power inevitably results in device power dissipation, which may damage the device and/or impair its performance. Therefore, packaging and cooling technology solutions are employed for the removal or dissipation of heat generated by the power semiconductor devices. Packaging is critical for the power density and assembly or manufacturing cost of an electronic equipment including multiple power semiconductor devices. The electronic equipment includes industrial low voltage, medium voltage drivers and converters, power inverters, etc.

A conventional packaging structure for power semiconductor devices usually comprises a mounting plate and multiple heat sinks. Every power semiconductor device is fixed on an upper surface of a heat sink through a metal plate at the bottom of the power semiconductor device. A thermal grease is applied on a contact surface of the metal plate and the heat sink to realize close contact, avoid air gaps and improve heat transfer. Each heat sink has a flow channel inside it for a coolant flowing through to remove heat generated by the power semiconductor devices. The multiple heat sinks are installed on the common mounting plate to form a whole unit. A configuration of a conventional packaging structure is shown in FIG. 1. There are four heat sinks 121, 122, 123, 124 installed on a mounting plate 110. Taking the heat sink 121 as an example, the heat sink 121 comprises a flat surface which is separated into two flat areas 1213, 1214 by a separation wall 1212 protruding from the flat surface. A power semiconductor devices 131 has a bottom fixed on a metal plate 141. The metal plate 141 is installed on the heat sink 121, so that the power semiconductor device 131 is fixed on the flat area 1213 of the heat sink 121. A thermal grease is placed between the metal plate 141 and the flat area 1213. The other power semiconductor device 132 is installed on the flat area 1214 of the heat sink 121 with the same method. The heat sink 121 comprises a flow channel (not shown in FIG. 1) inside it which has an inlet 1215 and an outlet 1216 for allowing a coolant to flow in and flow out respectively. The coolant, such as water, air, or other fluid is forced to flow through the flow channel, so that the heat transferred from the power semiconductor devices 131, 132 to the heat sinks 121 can be removed by the coolant. Each of the other heat sinks 122, 123, 124 has a similar structure to the heat sink 121. As mentioned above, the conventional packaging structure usually comprises many components including the mounting plate, the multiple heat sinks, multiple metal plates, and the thermal grease. Thus, the conventional packaging structure usually has a complex structure, and results in high manufacture and assembly cost.

Therefore, there is a need for improved power semiconductor packaging apparatus to solve at least one of the above-mentioned issues.

BRIEF DESCRIPTION

One aspect of the present disclosure provides an integrated power semiconductor packaging apparatus. The integrated power semiconductor packaging apparatus comprises a plurality of power semiconductor devices and an electrically insulative substrate formed integrally. The electrically insulative substrate comprises a flat surface, at least one separation wall protruding from the flat surface and a flow channel inside the electrically insulative substrate. The at least one separation wall is configured to separate the flat surface into a plurality of flat areas. Each of the flat areas is configured to receive one of the power semiconductor devices. The flow channel is configured for allowing a coolant flowing through to remove heat generated from the plurality of power semiconductor devices.

Another aspect of the present disclosure provides a power converter. The power converter comprises an integrated power semiconductor packaging apparatus which comprises a plurality of power semiconductor devices and an electrically insulative substrate formed integrally. The electrically insulative substrate comprises a flat surface, at least one separation wall protruding from the flat surface and a flow channel inside the electrically insulative substrate. The at least one separation wall is configured to separate the flat surface into a plurality of flat areas. Each of the flat areas is configured to receive one of the power semiconductor devices. The flow channel is configured for allowing a coolant flowing through to remove heat from the plurality of power semiconductor devices.

The present disclosure provides an integrated packaging apparatus with a cooling flow channel, which can provide electrical insulation and mechanical support for multiple power semiconductor devices. It eliminates the use of thermal grease. In addition, since an electrically insulative material is used as a substrate for the power semiconductor devices, the creepage distance for isolation is enhanced and more tight packaging can be realized.

BRIEF DESCRIPTION OF THE DRAWINGS

The above and other aspects, features, and advantages of the present disclosure will become more apparent in light of the subsequent detailed description when taken in conjunction with the accompanying drawings in which.

DETAILED DESCRIPTION

Figure 1:
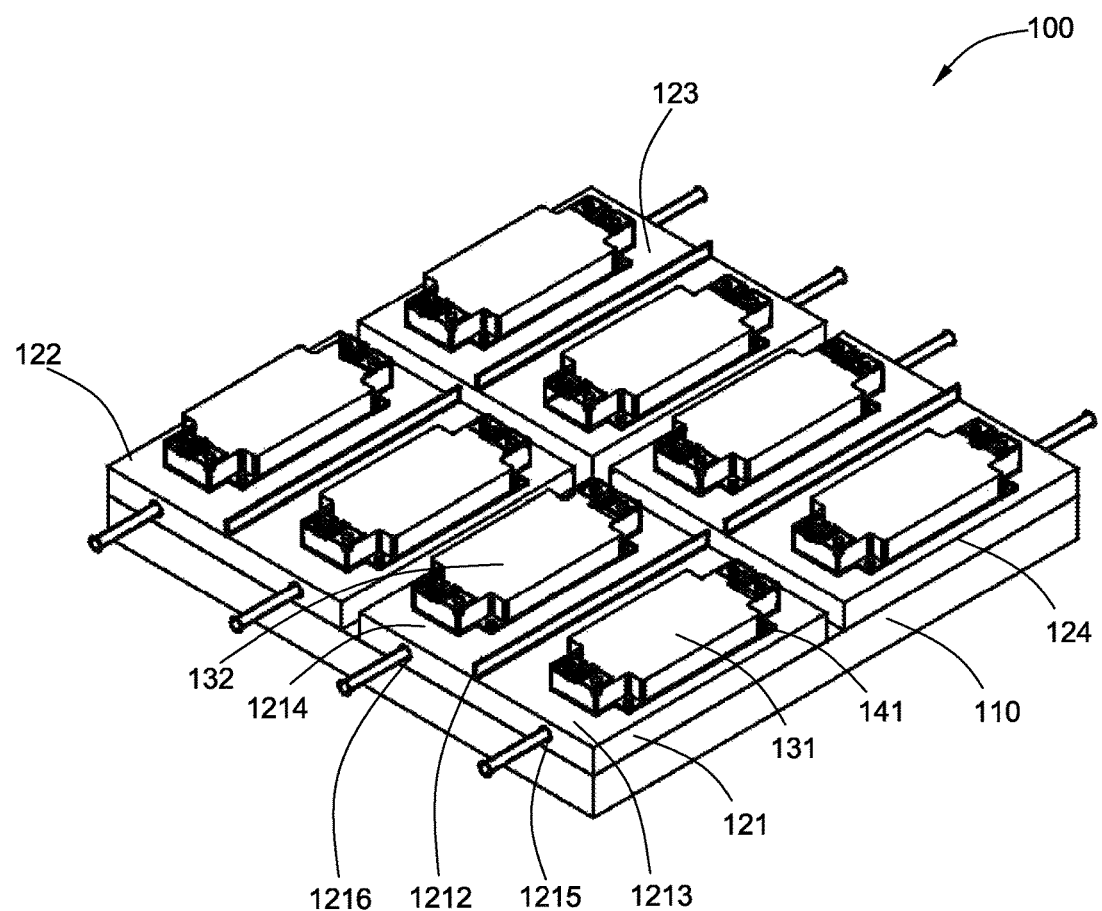
FIG. 1 is a schematic diagram of a conventional power semiconductor packaging apparatus.

Unless defined otherwise, technical and scientific terms used herein have the same meaning as is commonly understood by one of skill in the art to which this invention belongs. The terms "a" and "an" do not denote a limitation of quantity, but rather denote the presence of at least one of the referenced items. Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. Additionally, when using an expression of "about a first value—a second value," the about is intended to modify both values. In at least some instances, the approximating language may correspond to the precision of an instrument for measuring the value. Here, and throughout the specification and claims, range limitations may be combined and/or interchanged, such ranges are identified and include all the sub-ranges contained therein unless context or language indicates otherwise. Moreover, the suffix "(s)" as used herein is usually intended to include both the singular and the plural of the term that it modifies, thereby including one or more of that term.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The present disclosure relates to an integrated power semiconductor packaging apparatus, comprising a plurality of power semiconductor devices and an electrically insulative substrate formed integrally. The electrically insulative substrate comprises a flat surface, at least one separation wall protruding from the flat surface and a flow channel inside the electrically insulative substrate. The at least one separation wall is configured to separate the flat surface into a plurality of flat areas. Each of the flat areas is configured to receive one of the power semiconductor devices. The flow channel is configured for allowing a coolant flowing through to remove heat from the plurality of power semiconductor devices.

The plurality of power semiconductor devices may be all the same, or, at least two of the power semiconductor devices are different from each other. The number, type, size, and position arrangement of the power semiconductor devices on the electrically insulative substrate depend on the function requirements and specific needs of an electronic equipment adopting the integrated packaging apparatus of the present disclosure.

Figure 2:
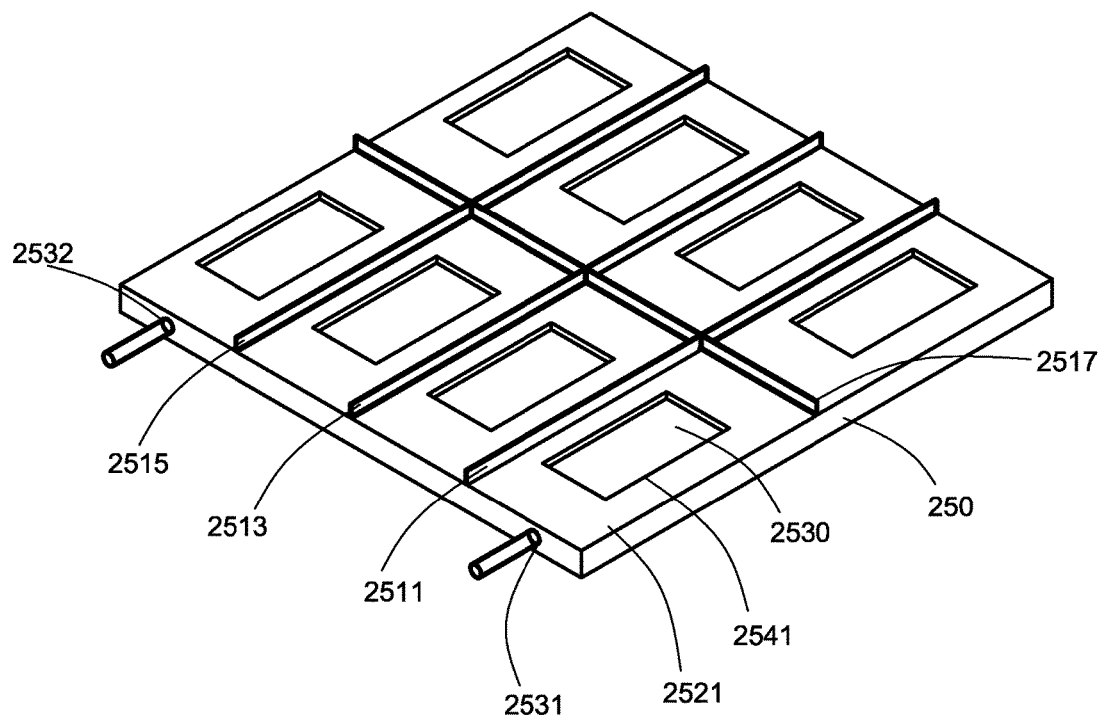
FIG. 2 is a schematic diagram of an electrically insulative substrate in accordance with one embodiment of the present disclosure.

The shape of the electrically insulative substrate may be various. In an embodiment, the electrically insulative substrate is flat-plate-shaped having an upper flat surface and a bottom flat surface opposite to the upper flat surface. FIG. 2 shows an embodiment of an electrically insulative substrate 250 of flat-plate-shaped. As shown in FIG. 2, the electrically insulative substrate 250 has an upper flat surface which is separated into eight flat areas by four separation walls 2511, 2513, 2515, 2517 protruding from the upper flat surface. The flat area 2521 is separated by the separation walls 2511, 2517. The separation walls 2511, 2513, 2515, 2517 are formed integrally with the electrically insulative substrate 250. The separation walls 2511, 2513, 2515, 2517 not only can enhance creepage distance for isolation between two adjacent power semiconductor devices, but also can improve the mechanical strength of the electrically insulative substrate 250. In some embodiments, the separation walls 2511, 2513, 2515, 2517 may be very thick, so that the upper flat surface of the electrically insulative substrate 250 is pocket-like.

A flow channel 2530 is inside the electrically insulative substrate 250. As shown in FIG. 2, the flow channel 2530 comprises an inlet 2531 and an outlet 2532 for allowing a coolant to flow in and flow out respectively. In some embodiments, the flow channel 2530 may have more than one inlet or outlet. The flow channel 2530 between the inlet 2531 and the outlet 2532 may be designed to make sure that the coolant can flow through every flat area of the electrically insulative substrate 250 where the power semiconductor device is fixed. In some embodiments, the flow channel 2530 may be one or more cavities inside the electrically insulative substrate 250. In addition, the flow channel 2530 may have various patterns, such as S-shaped, U-shaped, M-shaped. In an embodiment, the flow channel 2530 comprises a serpentine pattern. In some embodiments, the pattern of the flow channel 2530 is designed according to the heat dissipation requirement of each power semiconductor device placed on each of the flat areas. For example, for a power semiconductor device which may generate more heat than others, an increased heat exchange area of the flow channel 2530 under this power semiconductor device may be employed. And the power semiconductor device which may generate more heat may be disposed near the inlet 2531 of the flow channel 2530.

The coolant flowing through the flow channel inside the electrically insulative substrate is a fluid which can remove the heat produced by the power semiconductor devices. An ideal coolant has high thermal capacity, low viscosity, is low cost, non-toxic, chemical inert, and neither causes nor promotes corrosion of the cooling channels. The most common coolant is water, deionized water. The very pure deionized water, due to its relatively low electrical conductivity, is very suitable to cool these electrical devices.

As shown in FIG. 2, each of the flat areas of the electrically insulative substrate 250 may further comprise a hole, for example, the flat area 2521 comprises a hole 2541. When a power semiconductor device is disposed on the flat area 2521, the hole 2541 is covered and can eliminate an electrically insulative layer between the coolant in the flow channel 2530 and the power semiconductor device, to realize direct contact and increase heat transfer. The size and shape of the hole 2541 may vary as long as the hole 2541 can be covered by the power semiconductor device disposed on the flat area 2521, and there is no coolant leakage from the hole 2541. In FIG. 2, the holes in the eight flat areas are all rectangular-shaped.

Usually, the electrically insulative substrate 250 is made from one or more electrically insulative materials. The electrically insulative material may be a plastic material, a ceramic matrix composite material, a polymer matrix composite material, or any suitable advanced material entering the market. In some embodiments, the electrically insulative substrate 250 is made from a thermoplastic material, such as ployphenylene sulfide (PPS), polyamide (PA), polytetrafluoroethylene (PTFE) or a combination thereof. In the conventional packaging structure described above, the heat sinks where the power semiconductor devices are fixed are usually made of aluminum. The present disclosure employs an electrically insulative material, which may greatly enhance creepage distance for isolation and realize more tight packaging structure. The other advantage of employing an electrically insulative material may be light weight. So light weight electronic equipment, such as power converter, may be achieved with the integrated packaging apparatus of the present disclosure.

The electrically insulative substrate 250 is formed integrally. In some embodiments, one or more thermoplastic materials are used as raw materials, and the manufacturing process may include various polymer processing techniques such as injection molding, compression molding, calendering, and extrusion. In an embodiment, injection molding is used to produce the electrically insulative substrate 250. In addition, additive manufacturing or 3D printing technology may also be used for manufacturing of the electrically insulative substrate 250. Additive manufacturing, which builds 3D objects by adding layer-upon-layer of material, can produce complex, precisely designed shapes. Therefore, for the manufacturing of the electrically insulative substrate 250 with a flow channel inside, additive manufacturing is a good choice to be employed, in particular for an electrically insulative substrate with a special designed flow channel inside. Since the electrically insulative substrate 250 is formed integrally, the packaging apparatus has fewer components, so the automatic assembly and manufacturing of the integrated packaging apparatus become easier.

Figure 3:
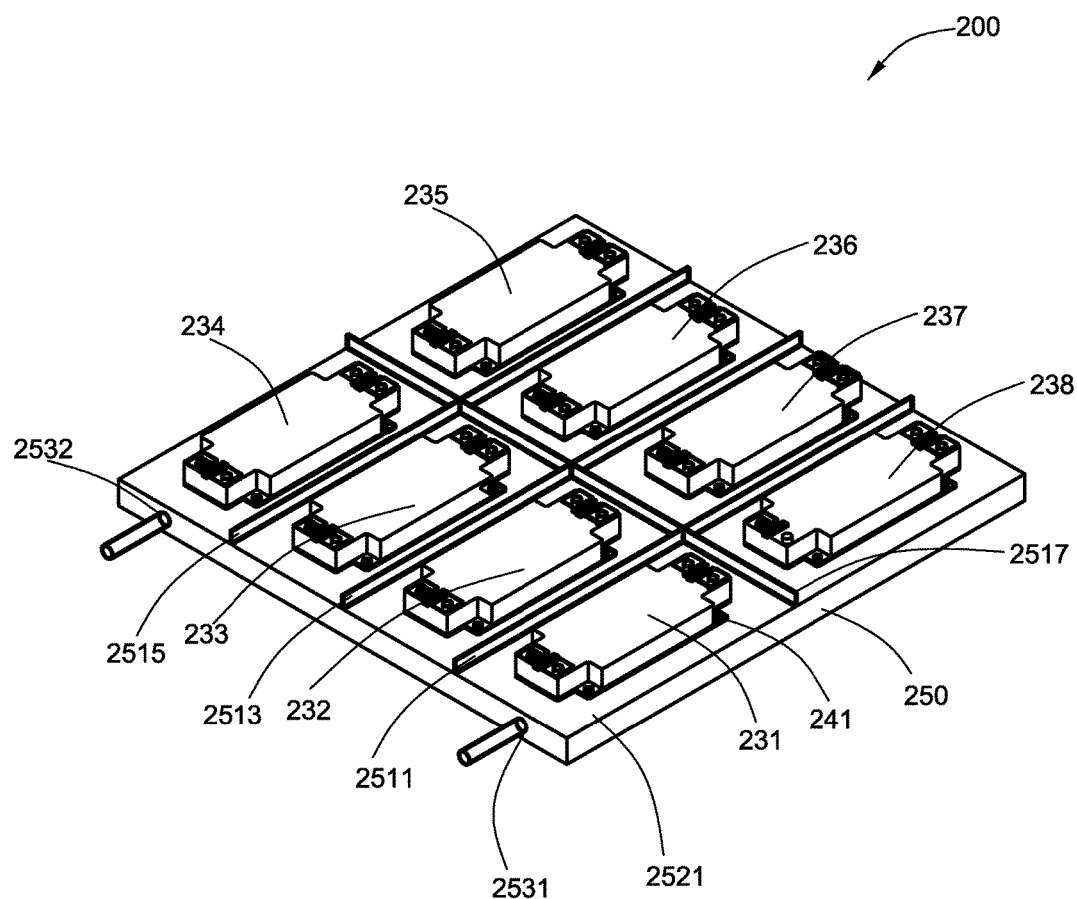
FIG. 3 a schematic diagram of an integrated power semiconductor packaging apparatus in accordance with one embodiment of the present disclosure.

FIG. 3 shows an integrated power semiconductor packaging apparatus 200 with the electrically insulative substrate 250 of FIG. 2. Each of eight power semiconductor devices 231-238 is respectively installed on one of the eight flat areas of the electrically insulative substrate 250 via a metal plate. Take the power semiconductor device 231 as an example, the power semiconductor device 231 is fixed on a metal plate 241. The power semiconductor device 231 is installed on the flat area 2521 through coupling the metal plate 241 to the flat area 2521, so that the hole 2541 on the flat area 2521 (FIG. 2) is covered by the metal plate 241. When a coolant is flowing through the flow channel 2530, direct contact between the coolant and the metal plate 241 can be realized to improve cooling performance. Usually, the size of the hole 2541 is as large as possible to get a large heat exchange area. In addition, it is critical to seal the metal plate 241 and the hole 2541 to prevent leakage of the coolant. One example is to use a fastener, such as screw, and a sealing ring, such as a rubber sealing ring, to fix the metal plate 241 to the flat area 2521 and cover the hole 2541. The other power semiconductor devices 232-238 may be installed on their corresponding flat areas with a similar method to the power semiconductor device 231.

At least one of the power semiconductor devices 231-238 of the integrated packaging apparatus 200 may comprise an insulated-gate bipolar transistor (IGBT), a metal-oxide-semiconductor field-effect transistor (MOSFET), or a diode. In some embodiments, at least one of the power semiconductor devices 231-238 comprises a silicon carbide (SiC) power semiconductor device or a gallium nitride (GaN) power semiconductor device.

The integrated power semiconductor packaging apparatus 200 of the present disclosure may minimize the packaging size of multiple power semiconductor devices and improve the power density. With the integrated packaging apparatus 200 of the present disclosure, low cost, light weight and high power density electronic equipment, such as power converter, may be achieved.

Figure 4:
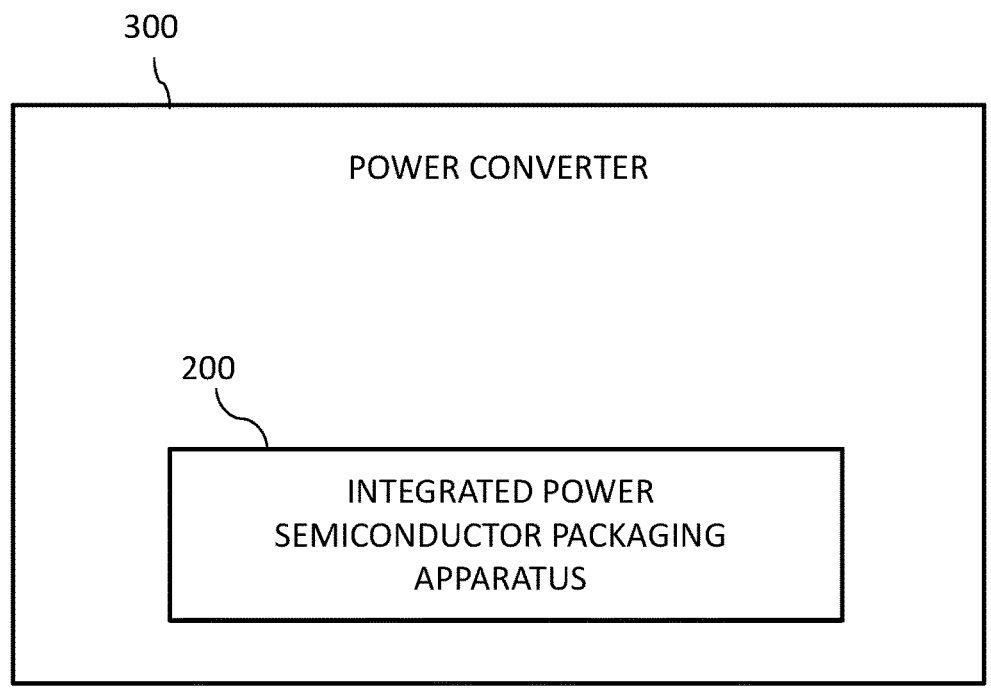
FIG. 4 is a block diagram of a power converter including the integrated power semiconductor packaging apparatus in accordance with one embodiment of the present disclosure

The present disclosure also relates to a power converter 300 as shown in FIG. 4, including the integrated power semiconductor packaging apparatus 200 as described above. It should be understood that besides the integrated power semiconductor packaging apparatus, the power converter 300 may also comprise other appropriate components and/or circuits to achieve a required function of the power converter 300.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An integrated power semiconductor packaging apparatus, comprising:
   a plurality of power semiconductor devices; and
   an electrically insulative substrate formed integrally, comprising:
   a flat surface;
   at least one separation wall protruding from the flat surface and configured to separate the flat surface into a plurality of flat areas, wherein each of the flat areas is configured to receive one of the power semiconductor devices; and a flow channel inside the electrically insulative substrate for allowing a coolant flowing through to remove heat from the plurality of power semiconductor devices, wherein one power semiconductor device is fixed on a metal plate, the metal plate is installed on one of the flat areas, and the one flat area comprises a hole to realize direct contact between the coolant in the flow channel and the metal plate.

2. The apparatus of claim 1, wherein the metal plate is installed on the one flat area through a fastener and a sealing ring.

3. The apparatus of claim 1, wherein the electrically insulative substrate comprises a plastic material, a ceramic matrix composite material or a polymer matrix composite material.

4. The apparatus of claim 1, wherein the electrically insulative substrate is formed by injection molding or additive manufacturing process.

5. The apparatus of claim 1, wherein the coolant comprises deionized water.

6. The apparatus of claim 1, wherein the flow channel is a serpentine channel.

7. The apparatus of claim 1, wherein one of the power semiconductor devices comprises an insulated-gate bipolar transistor, a metal-oxide-semiconductor field-effect transistor, or a diode.

8. The apparatus of claim 1, wherein one of the power semiconductor devices comprises a silicon carbide power semiconductor device or a gallium nitride power semiconductor device.

9. A power converter, comprising an integrated power semiconductor packaging apparatus, the integrated power semiconductor packaging apparatus comprising:
  a plurality of power semiconductor devices; and
  an electrically insulative substrate formed integrally, comprising:
  a flat surface;
  at least one separation wall protruding from the flat surface and configured to separate the flat surface into a plurality of flat areas, wherein each of the flat areas is configured to receive one of the power semiconductor devices; and a flow channel inside the electrically insulative substrate for allowing a coolant flowing through to remove heat from the plurality of power semiconductor devices, wherein one power semiconductor device is fixed on a metal plate, the metal plate is installed on one of the flat areas, and the one flat area comprises a hole to realize direct contact between the coolant in the flow channel and the metal plate.

* * * * *